US012638535B2

(12) United States Patent (10) Patent No.: US 12,638,535 B2
Wu et al. (45) Date of Patent: May 26, 2026

(54) MEASUREMENT CORRECTION METHOD AND APPARATUS FOR SENSOR, AND SERVER POWER SUPPLY

(71) Applicant: INSPUR SUZHOU INTELLIGENT TECHNOLOGY CO., LTD., Suzhou (CN)

(72) Inventors: Mingwei Wu, Suzhou (CN); Hongrui Han, Suzhou (CN)

(73) Assignee: INSPUR SUZHOU INTELLIGENT TECHNOLOGY CO., LTD., Suzhou (CN)

( * ) Notice: Subject to any disclaimer, the term of this patent is extended or adjusted under 35 U.S.C. 154(b) by 324 days.

(21) Appl. No.: 18/259,735

(22) PCT Filed: Dec. 30, 2021

(86) PCT No.: PCT/CN2021/142858
§ 371 (c)(1),
(2) Date: Jun. 28, 2023

(87) PCT Pub. No.: WO2023/010790
PCT Pub. Date: Feb. 9, 2023

(65) Prior Publication Data
US 2024/0061061 A1 Feb. 22, 2024

(30) Foreign Application Priority Data
Aug. 5, 2021 (CN) .......................... 202110893892.2

(51) Int. Cl.
*G01R 35/00* (2006.01)
*G01R 15/14* (2006.01)
(52) U.S. Cl.
CPC ......... *G01R 35/005* (2013.01); *G01R 15/144* (2013.01)

(58) Field of Classification Search
CPC ................ G01R 35/005; G01R 15/144; G01R 19/0084; G01R 31/40
See application file for complete search history.

(56) References Cited

U.S. PATENT DOCUMENTS 4,229,692 A * 10/1980 Graeme .................. G01L 1/225
324/706
2014/0316735 A1 10/2014 Jao
(Continued)

FOREIGN PATENT DOCUMENTS

CN 102269776 A 12/2011
CN 105353335 A 2/2016
(Continued)

OTHER PUBLICATIONS

Wang, Hu, et al., "PMSM Current Sampling Error Elimination Method Based on Voltage Feedback", Control Engineering of China, vol. 28, No. 7, Jul. 31, 2021, ISSN: 1671-784.
(Continued)

*Primary Examiner* — Eman A Alkafawi
*Assistant Examiner* — Dilara Sultana
(74) *Attorney, Agent, or Firm* — Merchant & Gould P.C.

(57) ABSTRACT

A measurement correction method and apparatus for a sensor, and a server power supply. The method is applied to a sensor comprising a shunt resistor and a differential amplifier, and comprises: performing compensation verification on the sensor in advance to obtain a compensation coefficient of the sensor (S1); obtaining a voltage signal output by the sensor (S2); and correcting the voltage signal according to an error value of the shunt resistor and the compensation coefficient to obtain a voltage correction signal for use in system optimization management (S3).

18 Claims, 5 Drawing Sheets

(56)         References Cited

U.S. PATENT DOCUMENTS

| | | | | |
|---|---|---|---|---|
| 2015/0219690 A1* | 8/2015 | Kaya | .................. | G01R 19/0092 |
| | | | | 324/126 |
| 2017/0212154 A1* | 7/2017 | Otsuka | .................. | F16D 48/064 |
| 2018/0287488 A1 | 10/2018 | Chan | | |
| 2019/0128932 A1* | 5/2019 | Fernandez | ......... | G01R 19/2506 |
| 2020/0386788 A1* | 12/2020 | Cho | ........................ | G01R 35/00 |
| 2021/0072336 A1* | 3/2021 | Hou | ..................... | G01R 35/005 |

FOREIGN PATENT DOCUMENTS

| | | | | |
|---|---|---|---|---|
| CN | 105659326 A | | 6/2016 | |
| CN | 106093521 A | | 11/2016 | |
| CN | 106226682 A | | 12/2016 | |
| CN | 106405460 A | | 2/2017 | |
| CN | 106950524 A | | 7/2017 | |
| CN | 108089141 A | * | 5/2018 | ............ G01R 35/00 |
| CN | 109870666 A | | 6/2019 | |
| CN | 112557987 A | | 3/2021 | |
| CN | 112578328 A | | 3/2021 | |
| CN | 113341362 A | | 9/2021 | |
| JP | 2015224975 A | | 12/2015 | |
| JP | 2017129526 A | * | 7/2017 | |
| JP | 2018125938 A | * | 8/2018 | |
| TW | 200834049 A | | 8/2008 | |
| TW | 201120458 A | | 6/2011 | |

OTHER PUBLICATIONS

Wu, Haonan, et al. "Design of a Low Temperature Drift UVLO Circuit with Base Current Compensation", 2019 IEEE International Conference on Electron Devices and Solid-State Circuits (EDSSC), Jul. 4, 2019.

Fang, Wentian, "Design of Correction Device for Harmonic Measurement of Capacitor Voltage Transformer", Heilongjiang Electric Power, vol. 6, No. 3, Jun. 30, 2020, ISSN: 2095-6843.

International Search Report and Written Opinion received for PCT Serial No. PCT/CN2021/142858 on Apr. 20, 2022, 12 pgs.

Chinese Search Report received for CN Serial No. 2021108938922, 2 pgs.

* cited by examiner

Perform compensation verification on a sensor in advance to obtain a compensation coefficient of the sensor — S1

Acquire voltage signal outputted through the sensor — S2

Correct the voltage signal based on an error value of the shunt resistor and the compensation coefficient to obtain a voltage correction signal for using in system optimization management — S3

Fig. 3

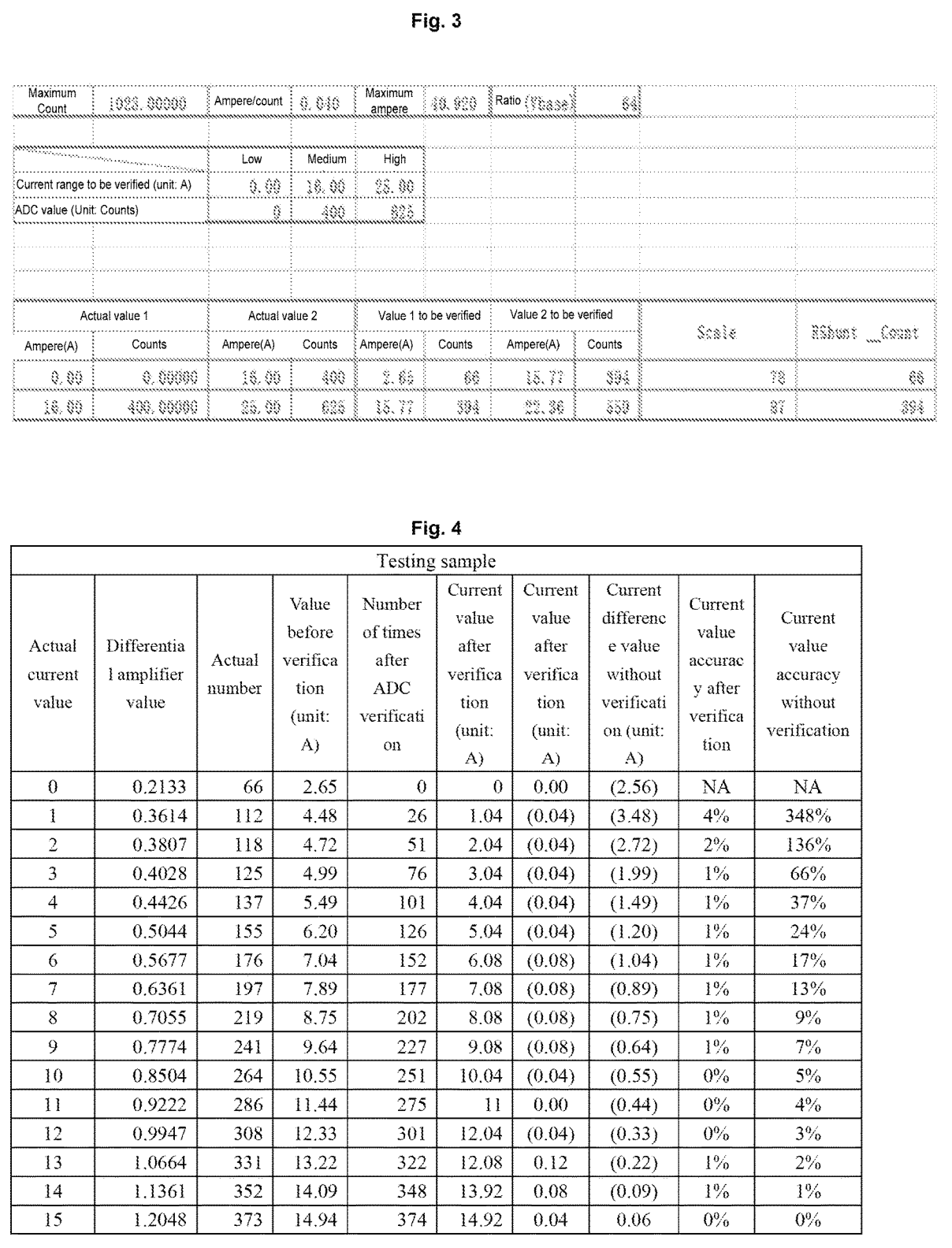

| Maximum Count | 1033.0000 | Ampere/count | 0.010 | Maximum ampere | 10.330 | Ratio (Ybase) | 64 |
|---|---|---|---|---|---|---|---|

| | Low | Medium | High |
|---|---|---|---|
| Current range to be verified (unit: A) | 0.00 | 16.00 | 25.00 |
| ADC value (Unit: Counts) | 0 | 400 | 625 |

| Actual value 1 | | Actual value 2 | | Value 1 to be verified | | Value 2 to be verified | | Scale | RShunt_Count |
|---|---|---|---|---|---|---|---|---|---|
| Ampere(A) | Counts | Ampere(A) | Counts | Ampere(A) | Counts | Ampere(A) | Counts | | |
| 0.00 | 0.00000 | 16.00 | 400 | 2.65 | 66 | 15.77 | 394 | 73 | 66 |
| 16.00 | 400.00000 | 25.00 | 625 | 15.77 | 394 | 25.36 | 659 | 87 | 394 |

Fig. 4

| Testing sample | | | | | | | | | | |
|---|---|---|---|---|---|---|---|---|---|---|
| Actual current value | Differential amplifier value | Actual number | Value before verification (unit: A) | Number of times after ADC verification | Current value after verification (unit: A) | Current value after verification (unit: A) | Current difference value without verification (unit: A) | Current value accuracy after verification | Current value accuracy without verification |
| 0 | 0.2133 | 66 | 2.65 | 0 | 0 | 0.00 | (2.56) | NA | NA |
| 1 | 0.3614 | 112 | 4.48 | 26 | 1.04 | (0.04) | (3.48) | 4% | 348% |
| 2 | 0.3807 | 118 | 4.72 | 51 | 2.04 | (0.04) | (2.72) | 2% | 136% |
| 3 | 0.4028 | 125 | 4.99 | 76 | 3.04 | (0.04) | (1.99) | 1% | 66% |
| 4 | 0.4426 | 137 | 5.49 | 101 | 4.04 | (0.04) | (1.49) | 1% | 37% |
| 5 | 0.5044 | 155 | 6.20 | 126 | 5.04 | (0.04) | (1.20) | 1% | 24% |
| 6 | 0.5677 | 176 | 7.04 | 152 | 6.08 | (0.08) | (1.04) | 1% | 17% |
| 7 | 0.6361 | 197 | 7.89 | 177 | 7.08 | (0.08) | (0.89) | 1% | 13% |
| 8 | 0.7055 | 219 | 8.75 | 202 | 8.08 | (0.08) | (0.75) | 1% | 9% |
| 9 | 0.7774 | 241 | 9.64 | 227 | 9.08 | (0.08) | (0.64) | 1% | 7% |
| 10 | 0.8504 | 264 | 10.55 | 251 | 10.04 | (0.04) | (0.55) | 0% | 5% |
| 11 | 0.9222 | 286 | 11.44 | 275 | 11 | 0.00 | (0.44) | 0% | 4% |
| 12 | 0.9947 | 308 | 12.33 | 301 | 12.04 | (0.04) | (0.33) | 0% | 3% |
| 13 | 1.0664 | 331 | 13.22 | 322 | 12.08 | 0.12 | (0.22) | 1% | 2% |
| 14 | 1.1361 | 352 | 14.09 | 348 | 13.92 | 0.08 | (0.09) | 1% | 1% |
| 15 | 1.2048 | 373 | 14.94 | 374 | 14.92 | 0.04 | 0.06 | 0% | 0% |

| 16 | 1.2715 | 394 | 15.77 | 0 | 0 | 16.00 | 0.23 | 100% | 1% |
| 17 | 1.3353 | 414 | 16.56 | 27 | 1.08 | 15.92 | 0.44 | 94% | 3% |
| 18 | 1.3975 | 433 | 17.33 | 53 | 2.12 | 15.88 | 0.67 | 88% | 4% |
| 19 | 1.4583 | 452 | 18.08 | 78 | 3.12 | 15.88 | 0.92 | 84% | 5% |
| 20 | 1.5161 | 470 | 18.80 | 103 | 4.12 | 15.88 | 1.20 | 79% | 6% |
| 21 | 1.5740 | 488 | 19.52 | 127 | 5.08 | 15.92 | 1.48 | 76% | 7% |
| 22 | 1.6307 | 506 | 20.22 | 151 | 6.04 | 15.96 | 1.78 | 73% | 8% |
| 23 | 1.6851 | 522 | 20.90 | 174 | 6.96 | 16.04 | 2.10 | 70% | 9% |
| 24 | 1.7429 | 540 | 21.61 | 198 | 7.92 | 16.08 | 2.39 | 67% | 10% |
| 25 | 1.8034 | 559 | 22.36 | 224 | 8.96 | 16.04 | 2.64 | 64% | 11% |

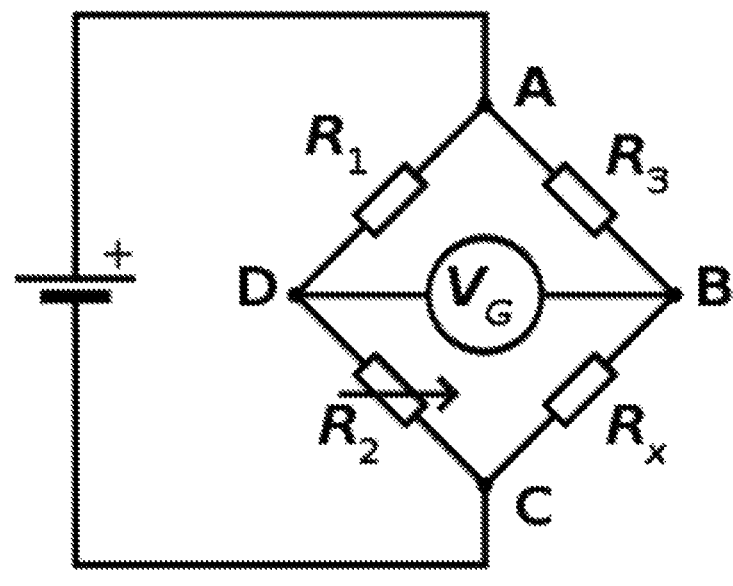
Fig. 7
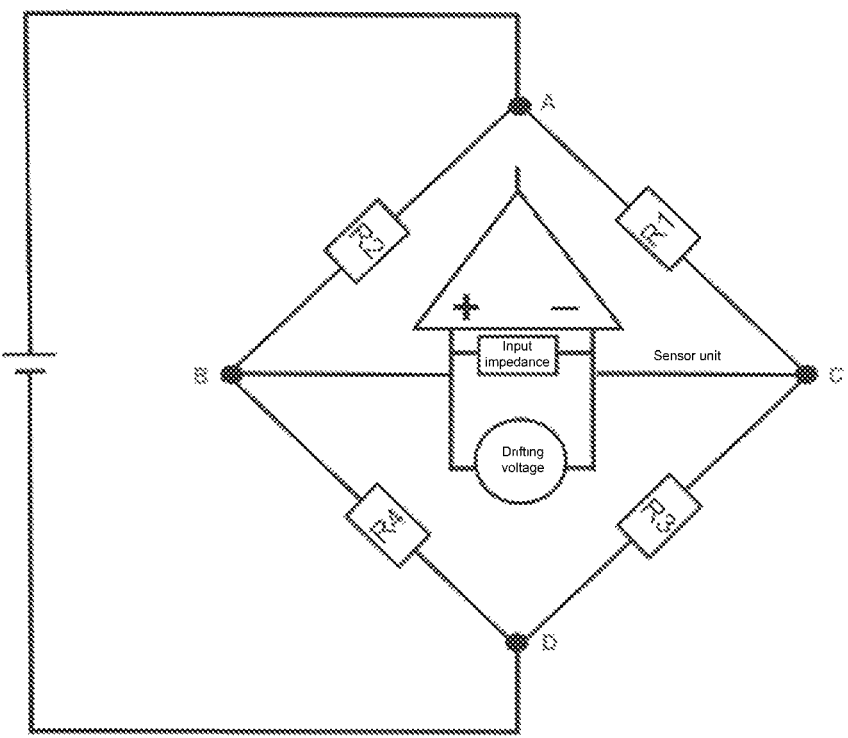

MEASUREMENT CORRECTION METHOD AND APPARATUS FOR SENSOR, AND SERVER POWER SUPPLY

CROSS-REFERENCE TO RELATED APPLICATION

This disclosure claims the priority to Chinese Patent Application No. 202110893892.2, filed to the China National Intellectual Property Administration on Aug. 5, 2021 and entitled "Measurement Correction Method and Apparatus for Sensor, and Server Power Supply", the disclosure of which is hereby incorporated by reference in its entirety.

TECHNICAL FIELD

The present disclosure relates to the field of server power supply management, and in particular, to a measurement correction method and apparatus for a sensor, and a server power supply.

BACKGROUND

A server system needs to read, from a server power supply, measurement values (such as a voltage measurement value, a current measurement value, a temperature measurement value, and a power measurement value) of sensors in the server system, to facilitate power supply management and system optimization. Currently, the sensors in the server power supply transmit self-measurement values to a Micro-controller Unit (MCU) of the server power supply. A server system uses a Baseboard Management Controller (BMC) to access the MCU of the server power supply by means of an Inter-Integrated Circuit Bus (I2C Bus), to acquire the values of the sensors.

Refer to FIG. 1, FIG. 1 is a circuit diagram of hardware of a sensor inside the server power supply in the prior art. The sensor includes a shunt resistor and a differential amplification circuit (a differential amplifier and set resistors R1, R2, R3, and R4). The working principle of the sensor includes: the shunt resistor converts a signal corresponding to a sensing source into a voltage signal; the differential amplification circuit amplifies (magnification being equal to R1/R3) the voltage signal converted by the shunt resistor, and transmits the amplified voltage signal to an Analog-to-Digital Converter (ADC) of an MCU of a server power supply; and the ADC converts a received analog signal into a digital signal for internal processing of the MCU. Generally, there are about 5-10 sensors in the server power supply to complete the sensing of signals required for the management of an entire power supply.

However, there are resistance errors in the shunt resistor and the set resistors in the sensor, and voltage drift exists in the differential amplifier, leading to an error in a voltage signal of the MCU of the server power supply read from the sensor, to make read accuracy relatively low. At present, in order to improve the read accuracy, a high-accuracy shunt resistor, a set resistor and low-voltage drift differential amplifier are generally selected. However, the high-accuracy shunt resistor and the low-voltage drift differential amplifier are very expensive, resulting in relatively high overall cost of the sensor in the server power supply.

Therefore, how to provide a solution to solve the above technical problems is the current problem to be solved by a person skilled in the art.

SUMMARY

The present disclosure provides a measurement correction method for a sensor. The method is applied to the sensor comprising a shunt resistor and a differential amplification circuit, and includes the following operations.

Compensation verification is performed on the sensor in advance, to obtain a compensation coefficient of the sensor. A voltage signal outputted by the sensor is acquired. The voltage signal is corrected based on an error value of the shunt resistor and the compensation coefficient to obtain a voltage correction for using in system optimization management.

In an embodiment, the compensation verification is performed on the sensor in advance to obtain the compensation coefficient of the sensor includes the following operations.

An instruction which enter a manual self-learning mode is received, and then the manual self-learning mode is entered. Based on different setting values of a load of a device where the sensor is located, initial measurement values to be verified of the sensor at the different setting values are obtained.

The compensation coefficient of the sensor is calculated based on a preset compensation coefficient relational expression $$V_{o\_real} = (ADC_{Count} - Rshunt_{Count}) * \frac{S_{cale}}{V_{Gain}},$$

wherein $s_{cale}$ is the compensation coefficient; $A1_{ADC_{Count}}$ is an actual digital signal value of a parameter to be measured corresponding to the sensor at a first load setting value; $A2_{ADC_{Count}}$ is an actual digital signal value of the parameter to be measured at a second load setting value; $B1_{ADC_{Count}}$ is a digital signal value corresponding to the initial measurement value to be verified of the sensor at the first load setting value; and $B2_{ADC_{Count}}$ is a digital signal value corresponding to the initial measurement value to be verified of the sensor at the second load setting value.

In an embodiment, the voltage signal is corrected based on the error value of the shunt resistor and the compensation coefficient, to obtain the voltage correction signal includes the following operation.

The voltage signal is corrected based on a preset voltage correction relational expression $$V_{o\_real} = (ADC_{Count} - Rshunt_{Count}) * \frac{S_{cale}}{V_{Gain}}$$

to obtain the voltage correction signal, wherein Vo_real is the voltage correction signal; $ADC_{Count}$ is a digital signal value corresponding to the voltage signal; $Rshunt_{Count}$ is a digital signal value corresponding to the error value of the shunt resistor; and $V_{Gain}$ is a gain value of the differential amplification circuit.

In an embodiment, the measurement correction method for a sensor further includes the following operations.

in response to an automatic self-learning mode being triggered, the automatic self-learning mode is entered. A new measurement value to be verified of the sensor at a current load setting value is acquired.

An updated compensation coefficient of the sensor is calculated based on a preset compensation coefficient update relational expression $$S'_{cale} = \frac{A2'_{ADC_{Count}} - A1'_{ADC_{Count}}}{B2'_{ADC_{Count}} - B1'_{ADC_{Count}}}$$

to correct the voltage signal based on the updated compensation coefficient, where $S'_{cale}$ is the updated compensation coefficient; $B2'_{ADC_{Count}}$ is a digital signal value corresponding to the new measurement value to be verified; and $A2'_{ADC_{Count}}$ is an actual digital signal value of the parameter to be measured at the current load setting value.

In an embodiment, the automatic self-learning mode is triggered includes the following operations.

In response to the device where the sensor being located operates, measurement values to be verified of the sensor at the current load setting value are acquired for multiple times, and based on a moving average algorithm, an average measurement value to be verified of multiple acquired measurement values to be verified is calculated.

The automatic self-learning mode is triggered in response to a difference value between the average measurement value to be verified and the initial measurement value to be verified corresponding to the sensor at the current load setting value being greater than a preset error threshold.

In an embodiment, the automatic self-learning mode is triggered includes the following operations.

An instruction which enter the automatic self-learning mode is received, and then the automatic self-learning mode is triggered. A condition for issuing the instruction which enter the automatic self-learning mode is that, a difference value of an average value of the measurement values to be verified of the sensor at the current load setting value acquired for multiple times higher than an intermediate value of the measurement values to be verified acquired for multiple times does not reach a preset bias error threshold.

In an embodiment, the measurement correction method for a sensor further includes the following operations.

A function of entering the self-learning mode is pre-defined for a first instruction address of function to be defined in the device and a function returned by a self-learning mode state is pre-defined for a second instruction address of functions to be defined in the device. The self-learning mode includes the manual self-learning mode and the automatic self-learning mode.

In response to the instruction which enter the manual self-learning mode or the automatic self-learning mode being received, a setting value instructing to enter the manual self-learning mode or a setting value instructing to enter the automatic self-learning mode is written into the first instruction address to start entering the manual self-learning mode or the automatic self-learning mode.

A corresponding setting value is written into the second instruction address based on a learning state of the current self-learning mode, and information of the second instruction address written with the corresponding setting value is fed back to a system.

In an embodiment, the measurement correction method for a sensor further includes the following operation.

The measurement values to be verified that are acquired in the manual self-learning mode and the automatic self-learning mode are stored into a memory in the device to determine the total number of self-learning by querying stored content of the memory for using in managing capacity resources of the memory.

An embodiment of the present disclosure further provides a measurement correction apparatus for a sensor. The apparatus includes a memory, and at least one processor. The memory stores a computer-readable instruction, and in response to the computer-readable instruction being executed by the at least one processor, the at least one processor are enabled to execute steps of the measurement correction method for a sensor described in any one of the above.

An embodiment of the present disclosure finally further provides one or more non-transitory computer-readable storage media storing a computer-readable instruction. In response to the computer-readable instruction being executed by at least one processor, the at least one processor are enabled to execute steps of the measurement correction method for a sensor described in any one of the above.

An embodiment of the present disclosure further provides a server power supply. The server power supply includes a sensor and the measurement correction apparatus for a sensor. The sensor includes a shunt resistor, and a differential amplification circuit comprises a differential amplifier, a first resistor, a second resistor, a third resistor and a fourth resistor.

An input negative end of the differential amplifier is separately connected with a first end of the first resistor and a first end of the third resistor; a second end of the first resistor is connected with an output end of the differential amplifier; a second end of the third resistor is connected with a current output end of the shunt resistor; an input positive end of the differential amplifier is separately connected with a first end of the second resistor and a first end of the fourth resistor; a second end of the second resistor is connected with a reference end of the differential amplifier; a second end of the fourth resistor is connected with a current input end of the shunt resistor.

The ratio of the third resistor to the first resistor is equal to the ratio of the fourth resistor to the second resistor; and a gain value of the differential amplification circuit is adjusted by means of adjusting the ratio of the first resistor to the third resistor.

The details of one or more embodiments of the present disclosure are set forth in the drawings and the description below. Other features and advantages of the present disclosure will be apparent from the drawings and the claims from the specification.

BRIEF DESCRIPTION OF THE DRAWINGS

In order to describe the methods in embodiments of the present disclosure more clearly, the drawings required to be used in the prior art and the embodiments will be simply introduced below. It is apparent that the drawings in the following descriptions are only some embodiments of the present disclosure. Those of ordinary skill in the art may further obtain other drawings based on these drawings without creative work.

FIG. 3 is a schematic diagram of a current parameter based on one or more embodiments of the present disclosure.

FIG. 4 is a schematic diagram of compensation adjustment for a current parameter based on one or more embodiments of the present disclosure.

FIG. 7 is an equivalent circuit diagram of a sensor architecture based on one or more embodiments of the present disclosure.

DETAILED DESCRIPTION OF THE EMBODIMENTS

The core of the present disclosure is to provide a measurement correction method and apparatus for a sensor, and a server power supply. Read accuracy may be improved by using software to correct a voltage signal outputted by the sensor, that is, the read accuracy can be improved without selecting a high-accuracy shunt resistor and a low-voltage drift differential amplifier, such that the overall cost of the sensor in a server power supply is reduced.

In order to make objectives, methods, and advantages of embodiments of the present disclosure clearer, the methods in the embodiments of the present disclosure will be clearly and completely described below in combination with the drawings in the embodiments of the present disclosure. It is apparent that the described embodiments are part of the embodiments of the present disclosure, not all the embodiments. All other embodiments obtained by those of ordinary skill in the art on the basis of the embodiments in the present disclosure without creative work all fall within the scope of protection of the present disclosure.

Figure 2:
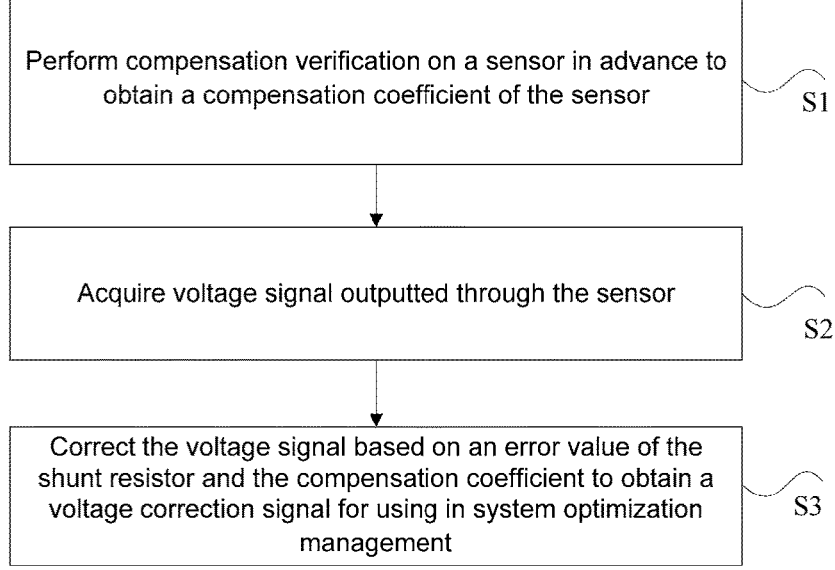
FIG. 2 is a flowchart of a measurement correction method for a sensor based on one or more embodiments of the present disclosure.

Refer to FIG. 2, FIG. 2 is a flowchart of a measurement correction method for a sensor based on an embodiment of the present disclosure.

The measurement correction method for the sensor is applied to the sensor comprising a shunt resistor and a differential amplification circuit, and includes the following steps.

At step S1, compensation verification is performed on the sensor in advance, to obtain a compensation coefficient of the sensor.

At step S2, a voltage signal outputted by the sensor is acquired.

At step S3, the voltage signal is corrected based on an error value of the shunt resistor and the compensation coefficient, to obtain a voltage correction for using in system optimization management.

In an embodiment, in the present disclosure, the compensation verification is performed on the sensor in advance, to obtain the compensation coefficient for using in subsequently correcting the voltage signal outputted by the sensor. In the present disclosure, the voltage signal outputted by the sensor is acquired; and after the voltage signal outputted by the sensor is acquired, the voltage signal outputted by the sensor is corrected based on the error value of the shunt resistor and the compensation coefficient of the sensor, to obtain the voltage correction for using in system optimization management.

It can be seen that, in the present disclosure, read accuracy may be improved by using software to correct the voltage signal outputted by the sensor, that is, the read accuracy can be improved without selecting a high-accuracy shunt resistor and a low-voltage drift differential amplifier, such that the overall cost of the sensor in a server power supply is reduced.

On the basis of the above embodiments:

as an optional embodiment, the compensation verification is performed on the sensor in advance to obtain the compensation coefficient of the sensor includes the following operations.

An instruction which enter a manual self-learning mode is received, and then the manual self-learning mode is entered.

Based on different setting values of a load of a device where the sensor is located, initial measurement values to be verified of the sensor at different setting values are obtained.

The compensation coefficient of the sensor is calculated based on a preset compensation coefficient relational expression $$S_{cale} = \frac{A2_{ADC_{Count}} - A1_{ADC_{Count}}}{B2_{ADC_{Count}} - B1_{ADC_{Count}}},$$

wherein $s_{cale}$ is the compensation coefficient; $A1_{ADC_{Count}}$ is an actual digital signal value of a parameter to be measured corresponding to the sensor at a first load setting value; $A2_{ADC_{Count}}$ is an actual digital signal value of the parameter to be measured at a second load setting value; $B1_{ADC_{Count}}$ is a digital signal value corresponding to the initial measurement value to be verified of the sensor at the first load setting value; and $B2_{ADC_{Count}}$ is a digital signal value corresponding to the initial measurement value to be verified of the sensor at the second load setting value.

In an embodiment, in the present disclosure, the compensation verification performed on the sensor may use the manual self-learning mode to learn the compensation coefficient of the sensor. In this case, a system may issue the instruction which enter the manual self-learning mode. In the present disclosure, after the instruction which enter the manual self-learning mode is received, the manual self-learning mode is entered.

In the present disclosure, an electronic loader (E-Load) may be used to manually adjust the load of the device (such as a server power supply) where the sensor is located. For example, the E-load is set to 0% load, or 50% load, or 100% load. In the present disclosure, based on different setting values of the load of the device where the sensor is located, measurement values (which are called initial measurement values to be verified) of the sensor at different setting values are obtained. On the basis of the initial measurement values to be verified of the sensor at different setting values, the compensation coefficient of the sensor may be calculated based on the preset compensation coefficient relational expression $$S_{cale} = \frac{A2_{ADC_{Count}} - A1_{ADC_{Count}}}{B2_{ADC_{Count}} - B1_{ADC_{Count}}},$$

wherein $A1_{ADC_{Count}}$ represents an actual value of the parameter to be measured corresponding to the sensor at the first load setting value; $A2_{ADC_{Count}}$ represents an actual value of the parameter to be measured at the second load setting value; $B1_{ADC_{Count}}$ represents the initial measurement value to be verified of the sensor at the first load setting value; and $B2_{ADC_{Count}}$ represents the initial measurement value to be verified of the sensor at the second load setting value; and $A1_{ADC_{Count}}$, $A2_{ADC_{Count}}$, $B1_{ADC_{Count}}$, and $B2_{ADC_{Count}}$ are all digital signal values converted by an ADC.

In an embodiment, the voltage signal is corrected based on the error value of the shunt resistor and the compensation coefficient, to obtain the voltage correction signal includes the following operation.

The voltage signal is corrected based on a preset voltage correction relational expression $$V_{o\_real} = (ADC_{Count} - Rshunt_{Count}) * \frac{S_{cale}}{V_{Gain}}$$

to obtain the voltage correction signal, wherein Vo_real is the voltage correction signal; $ADC_{Count}$ is a digital signal value corresponding to the voltage signal; $Rshunt_{Count}$ is a digital signal value corresponding to the error value of the shunt resistor; and $V_{Gain}$ is a gain value of the differential amplification circuit.

In an embodiment, the preset voltage correction relational expression of the voltage signal outputted by the sensor is $$(Vo\_real = (ADC_{Count} - Rshunt_{Count}) * \frac{S_{cale}}{V_{Gain}})$$

wherein $ADC_{Count}$ represents the digital signal value of the voltage signal outputted by the sensor that is converted by the ADC; $Rshunt_{Count}$ represents the digital signal value of the error value of the shunt resistor that is converted by the ADC, since the error value of the shunt resistor causes an error in the voltage signal outputted through the sensor, the parameter may be used to deduct the error, and the error required for compensation is generally 1%-3%; $V_{Gain}$ is the gain value of the differential amplification circuit, and is equal to $R1/R3$; and $s_{cale}$ is the compensation coefficient of the sensor. It is to be noted that, the maximum digital signal value converted by the ADC is 2n, which is also the maximum resolution ratio that may be provided by an MCU where the ADC is located. In response to n=10, that is, $2^{10}=1024$, it may cut up to 1023 times (0 does not count).

Figures 5, 6:
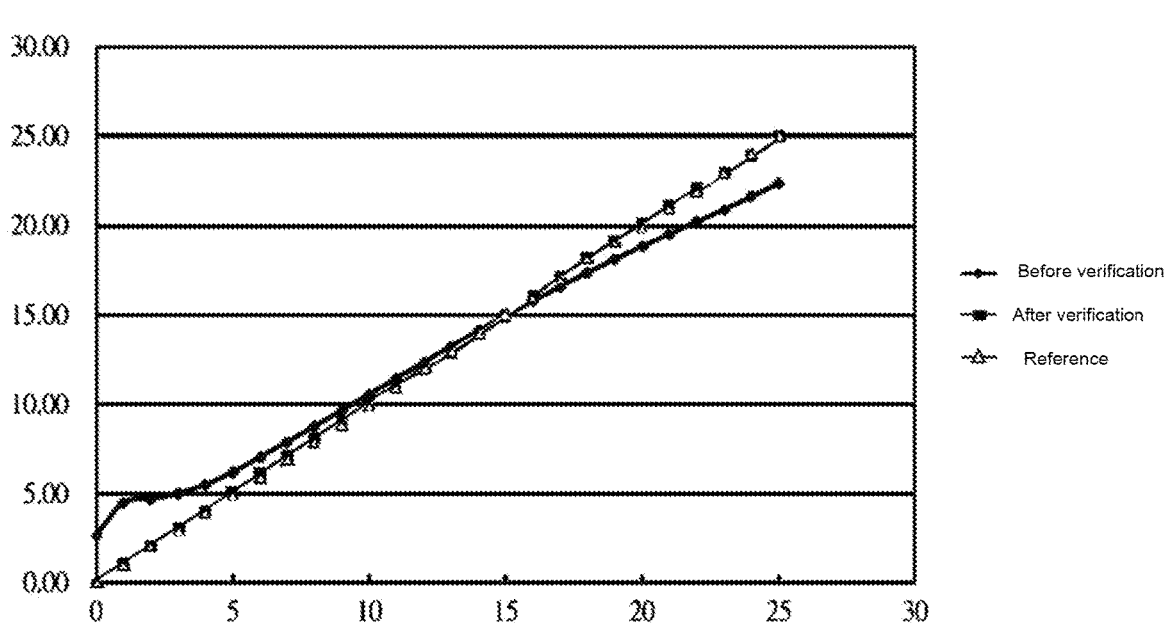
FIG. 5 is a curve chart of values of a sensor before and after correction based on one or more embodiments of the present disclosure.
FIG. 6 is an architecture diagram of a Wheatstone bridge based on one or more embodiments of the present disclosure.

In an embodiment, through using the correction of one current parameter as an example, a current range is 0 A-25 A, and one current parameter compensation adjustment is made. A current parameter is shown in FIG. 3, $$S_{cale} = \frac{\text{Actual value } 2_{ADC_{Count}} - \text{Actual value } 1_{ADC_{Count}}}{\text{Value to be verified } 2'_{ADC_{Count}} - \text{Value to be verified } 1_{ADC_{Count}}},$$

the compensation adjustment is performed on the current parameter of 0 A-25 A, to obtain a result shown in FIG. 4, and a comparison curve (a horizontal axis represents an actual current value/A, and a longitudinal axis represents a current value/A of the sensor) of values of the sensor before and after correction shown in FIG. 5; and a reference curve is an ideal value curve without any error, a pre-correction curve is the value of the sensor that is not corrected by firmware, and a post-correction curve is the value of the sensor that is corrected by the firmware. From this example, it can be learned that, a read error may be effectively compensated after being corrected by the firmware, and is close to an ideal value; and after 10% load (3 A), the accuracy of a reading section may reach within 1%.

In an embodiment, the measurement correction method for a sensor further includes the following operations.

In response to an automatic self-learning mode being triggered, the automatic self-learning mode is entered.

A new measurement value to be verified of the sensor at a current load setting value is acquired.

An updated compensation coefficient of the sensor is calculated based on a preset compensation coefficient update relational expression $$S'_{cale} = \frac{A2'_{ADC_{Count}} - A1_{ADC_{Count}}}{B2'_{ADC_{Count}} - B1_{ADC_{Count}}},$$

to correct the voltage signal based on the updated compensation coefficient, wherein $S'_{cale}$ is the updated compensation coefficient; $B2'_{ADC_{Count}}$ is a digital signal value corresponding to the new measurement value to be verified; and $A2'_{ADC_{Count}}$ is an actual digital signal value of the parameter to be measured at the current load setting value.

Further, after the device where the sensor is located operates for a period of time (for example, 3-5 years), the compensation coefficient of the sensor calculated on the basis of the initial measurement values to be verified of the sensor due to the deviation of the values caused by the aging of device components of the sensor is not accurate enough, in this case, the automatic self-learning mode may be triggered, to automatically learn the accurate compensation coefficient of the sensor.

In an embodiment, in response to the automatic self-learning mode being triggered, the automatic self-learning mode is entered.

On the basis of the current load setting value (usually does not change) of the device where the sensor is located, the new measurement value to be verified of the sensor at the current load setting value is acquired; and then the updated compensation coefficient of the sensor is calculated based on the preset compensation coefficient update relational expression $$S'_{cale} = \frac{A2'_{ADC_{Count}} - A1_{ADC_{Count}}}{B2'_{ADC_{Count}} - B1_{ADC_{Count}}}$$

to correct the voltage signal $$\left(V_{o\_real} = (ADC_{Count} - Rshunt_{Count}) * \frac{S'_{cale}}{V_{Gain}}\right)$$

based on the updated compensation coefficient, such that the deviation of the values caused by the aging of the device components of the sensor is compensated, where, $A2'_{ADC_{Count}}$ represents the actual digital signal value of the parameter to be measured corresponding to the sensor at the current load setting value; $B2'_{ADC_{Count}}$ represents the new measurement value to be verified of the sensor at the current load setting value; and $A2'_{ADC_{Count}}$ and $B2'_{ADC_{Count}}$ are digital signal values converted by the ADC.

In an embodiment, the automatic self-learning mode is triggered includes the following operations.

In response to the device where the sensor being located operates, measurement values to be verified of the sensor at the current load setting value are acquired for multiple times, and based on a moving average algorithm, an average measurement value to be verified of multiple acquired measurement values to be verified is calculated.

Whether the difference value between the average measurement value to be verified and the initial measurement value to be verified corresponding to the sensor at the current load setting value is greater than a preset error threshold is determined.

In response to the difference value between the average measurement value to be verified and the initial measurement value to be verified corresponding to the sensor at the current load setting value being greater than a preset error threshold being determined, the automatic self-learning mode is triggered.

In an embodiment, it is determined that the difference value between the average measurement value to be verified and the initial measurement value to be verified corresponding to the sensor at the current load setting value is greater than the preset error threshold, and the step of triggering the automatic self-learning mode is executed on the basis of a determination result.

In an embodiment, the first mode (autonomous triggering) of triggering the automatic self-learning mode includes: in response to the device where the sensor is located operating, the measurement value to be verified of the sensor at the current load setting value are continuously collected for multiple times (for example, 16 times), and the average measurement value to be verified of multiple acquired measurement values to be verified is calculated based on a Simple Moving Average (SMA) algorithm; then the average measurement value to be verified from the initial measurement value to be verified corresponding to the sensor at the current load setting value is subtracted, whether the difference value of the average measurement value to be verified and the initial measurement value to be verified is greater than the preset error threshold is determined, in response to the difference value of the average measurement value to be verified and the initial measurement value to be verified being not greater than the preset error threshold, the current compensation coefficient of the sensor is accurate, and the automatic self-learning mode is not triggered and in response to the difference value of the average measurement value to be verified and the initial measurement value to be verified being greater than the preset error threshold, the current compensation coefficient of the sensor is not accurate, and the automatic self-learning mode is triggered. It is to be noted that, the SMA algorithm may ensure that the change in the average value is consistent with the change in data, rather than changing over time, and it is less likely to cause false movements due to spurious signals.

Currently, there are seven levels of an electric meter: 0.1, 0.2, 0.5, 1.0, 1.5, 2.5, and 5.0 levels. In response to the value of the levels being smaller, the accuracy of the electric meter is higher. A common electric meter has three accuracy levels: 0.5S, level 1, and level 2. Level 2 indicates that a permissible error of the electric meter is within ±2%; and in response to the value of the levels being smaller, the accuracy of the electric meter is higher. The single-phase meters installed by the state grid to users are all level 2, with the permissible error within ±2%, such that the preset error threshold herein may be set to 2%, or may be set on the basis of other levels (for example, 1.0, 1.5, 2.5, and 5.0).

In an embodiment, the automatic self-learning mode is triggered includes the following operations.

An instruction which enter the automatic self-learning mode is received, and then the automatic self-learning mode is triggered. A condition for issuing the instruction which enter the automatic self-learning mode is that, a difference value of an average value of the measurement values to be verified of the sensor at the current load setting value acquired for multiple times higher than a median value of the measurement values to be verified acquired for multiple times does not reach a preset bias error threshold.

In an embodiment, the second mode (instruction triggering) of triggering the automatic self-learning mode includes: the system (for example, a server BMC) reading the values of the sensor in the device (such as the server power supply) at any time, to achieve system management optimization. In this case, the system may use a probability density function mean method of normal distribution to determine a standard bias error, that is, the measurement value to be verified of the sensor at the current load setting value is acquired for multiple times (for example, 16 times), the average value of the measurement values to be verified of the sensor acquired for multiple times is calculated, and the difference value of the average value of the measurement values to be verified of the sensor acquired for multiple times higher than a median value of the measurement values to be verified acquired for multiple times is calculated; in response to the difference value reaching the preset bias error threshold, it indicates that the current compensation coefficient of the sensor is accurate, and then the system does not issue the instruction which enter the automatic self-learning mode; and in response to the difference value does not reach the preset bias error threshold, it indicates that the current compensation coefficient of the sensor is not accurate, and then the system issues the instruction which enter the automatic self-learning mode. In the present disclosure, after the instruction which enter the automatic self-learning mode is received, the automatic self-learning mode is triggered.

It is to be noted that, a bias error of a standard deviation ($1\sigma$) of the standard bias error is 31.73%; the bias error of 2 standard deviations ($2\sigma$) is 4.55%; the bias error of 2.5 standard deviations ($2.5\sigma$) is 1%; and the bias error of 3 standard deviations ($3\sigma$) is 0.2%. Since the average value of the measurement values to be verified of the sensor acquired for multiple times needs to be 2.5 standard deviations higher than the median value of the measurement values to be verified acquired for multiple times, the preset bias error threshold here is selected to be 1%.

In an embodiment, the measurement correction method for a sensor further includes the following operations.

A function of entering the self-learning mode is predefined for a first instruction address of function to be defined in the device and a function returned by a self-learning mode state is pre-defined for a second instruction address of functions to be defined in the device. The self-learning mode includes the manual self-learning mode and the automatic self-learning mode.

In response to the instruction which enter the manual self-learning mode or the automatic self-learning mode being received, a setting value instructing to enter the manual self-learning mode or a setting value instructing to enter the automatic self-learning mode is written into the first instruction address to start entering the manual self-learning mode or the automatic self-learning mode.

A corresponding setting value is written into the second instruction address based on a learning state of the current self-learning mode, and information of the second instruction address written with the corresponding setting value is fed back to a system.

Further, by using a Power Management Bus (PMBus) 1.2 instruction set of a server Power Supply Unit (PSU) as an example, in the PMBus1.2 instruction set, a D1*h*-D3*h* instruction set is reserved for function expansion, and in the present disclosure, D1*h* and D2*h* addresses may be taken for self-learning function definition and expansion.

The D1*h* is defined as entering the self-learning mode: in response to 1 being written in a PSU PMBus instruction address D1*h* Bit 0, the automatic self-learning mode starts to be entered. In response to 0 being written in the PSU PMBus instruction address D1*h* Bit 0, the automatic self-learning mode is forced to be stepped out. In response to 1 being written in a PSU PMBus instruction address D1*h* Bit 1, the manual self-learning mode starts to be entered. In response to 0 being written in the PSU PMBus instruction address D1*h* Bit 1, the manual self-learning mode is forced to be stepped out.

The D2*h* is defined as returning a self-learning mode state: in response to a PSU PMBus instruction address D2*h* Bit 0 returning 1, it indicates that self-learning is completed; and in response to the PSU PMBus instruction address D2*h* Bit 0 returning 0, it indicates that self-learning is unsuccessful, such that the system or maintenance personnel may determine whether to perform further adjustment. In response to a PSU PMBus instruction address D2*h* Bit 1 returning 1, it indicates that the self-learning mode is formally entered. In response to the PSU PMBus instruction address D2*h* Bit 1 returning 0, that is, D2*h*=1, it indicates that the self-learning modes in all modes are successful.

Then the process of the manual self-learning mode includes (an automated test process may be set up, an industrial computer is used to execute PMBus instructions, and PSU load adjustment is completed by using the E-Load) the following.

The industrial computer sends the fact that 1 is written in the instruction address D1*h* Bit 1 to the PSU, and the PSU starts entering the manual self-learning mode. The industrial computer waits for the PSU to return whether the D2*h* Bit 1 is 1, and in response to the D2*h* Bit 1 being 1, it is determined that the PSU formally enters the manual self-learning mode.

1. In this case, the E-load is set to 0% load, and then waiting for 4 seconds, the PSU records the measurement values to be verified of the sensor at the 0% load. In this case, a Light-Emitting Diode (LED) of the server PSU flashes green light continuously.
2. Then, the E-load is set to 50% load, and then waiting for 4 seconds, the PSU records the measurement values to be verified of the sensor at the 50% load. In this case, the LED of the server PSU flashes the green light continuously.
3. Finally, the E-load is set to 100% load, and then waiting for 4 seconds, the PSU records the measurement values to be verified of the sensor at the 100% load. In this case, the LED of the server PSU flashes the green light continuously.
4. After the server PSU calculates digital values of the measurement values to be verified, the digital values of the measurement values to be verified are stored into an MCU Electrically-Erasable Programmable Read-Only Memory (EEPROM) of the PSU as an initial set value to learn the initial compensation coefficient of the sensor; then a D2*h*=1 value is returned to the industrial computer, indicating that manual self-learning is completed; and the manual self-learning mode is stepped out. In this case, the LED of the server PSU flashes the green light continuously. In response to the D2*h*=1 value is not returned to the industrial computer, indicating that verification is not completed, the process being returned to perform verification again.

The process of the server PSU self-starting the automatic self-learning mode includes the following.

1. The server PSU compares the value of the sensor at the current load setting value with the initial set value, in response to the error of the value and the initial set value being greater than ±2%, the automatic self-learning mode starts to be executed.
2. The server PSU sends the fact that a D2*h* position is equal to 1 to notify the system, to notify the server PSU to formally enter the automatic self-learning mode.
3. In this case, the server PSU uses the current system load as a correction value, and then waiting for 4 seconds, after the server PSU calculates the digital values of the measurement values to be verified, the digital values of the measurement values to be verified are stored into the MCU EEPROM of the PSU, but factory settings are not covered, such that the accurate compensation coefficient of the sensor is learned. In this case, the LED of the server PSU flashes the green light continuously.
4. The server PSU returns a D2*h* Bit 0=1 value to the system as a signal that the verification is completed, and the automatic self-learning mode is stepped out.

The process of a server BMC starting the automatic self-learning mode of the server PSU includes the following.

1. In response to the server BMC compares that the value of the sensor at the current load setting value being lower than 2.5 standard deviations, the server PSU is controlled to start executing the automatic self-learning mode.
2. The server PSU sends the fact that the D2*h* position is equal to 1 to notify the system by means of an Intelligent Platform Management Interface (IPMI) instruction of the BMC to notify the system PSU to formally enter the automatic self-learning mode.
3. In this case, the server PSU uses the current system load as the correction value, and then waiting for 4 seconds, after the server PSU calculates the digital values of the measurement values to be verified, the digital values of the measurement values to be verified are stored into the MCU EEPROM of the PSU, but factory settings are not covered, such that the accurate compensation coefficient of the sensor is learned. In this case, the LED of the server PSU flashes the green light continuously.
4. The server PSU returns a D2*h* Bit 0=1 value to the system as a signal that the verification is completed, and the automatic self-learning mode is stepped out.

In an embodiment, the measurement correction method for a sensor further includes the following operations.

The measurement values to be verified that are acquired in the manual self-learning mode and the automatic self-learning mode are stored into a memory in the device to determine the total number of self-learning by querying stored content of the memory for using in managing capacity resources of the memory.

In an embodiment, the above embodiments have mentioned that the measurement values to be verified that are acquired in the manual self-learning mode and the automatic self-learning mode may be stored into a memory in the device. The objective of this is that, the system may determine the total number of self-learning (the number of manual self-learning and the number of automatic self-learning) through querying stored content of the memory in the device for using by the system to manage capacity resources of the memory.

It is to be noted that, in response to the device where the sensor is located being the server PSU, the measurement correction method for a sensor may be implemented by means of the MCU in the server PSU. Currently, the server PSU completes functions of converter switch control, fan control, LED control, monitoring, protection and communication in a power supply by means of the MCU, and the MCU is divided into a primary-side MCU and a secondary-side MCU. Since the secondary-side MCU is the MCU mainly for communicating with the BMC, the measurement values to be verified are stored into the EEPROM of the secondary-side MCU. The server BMC may query a register of the MCU EEPROM in the server PSU by means of the IPMI instruction; such that whether the server PSU performs the self-learning mode is learned, and the total number of self-learning is learned.

In an embodiment, in the present disclosure, a Wheatstone bridge balance method is used to deduce and simplify a model of the differential amplifier.

As shown in FIG. 6, a Wheatstone bridge includes a resistor Rx to be measured, and a variable resistor R2, a resistor R1 and a resistor R3 with known resistance. The R1 is connected with the R2 in series, and the R3 is connected with the Rx in series; then the two circuits connected in series are connected in parallel; and a wire is connected between a midpoint of a wire between the R1 and the R2 and a midpoint of a wire between the R3 and the Rx, and a galvanometer VG is placed on the wire. In response to R2/R1=Rx/R3, there is no current flowing through the galvanometer (bridge nodes B and D), such that, in this case, components between the bridge nodes B and D are equivalent to invalid and may be removed.

Figure 1:
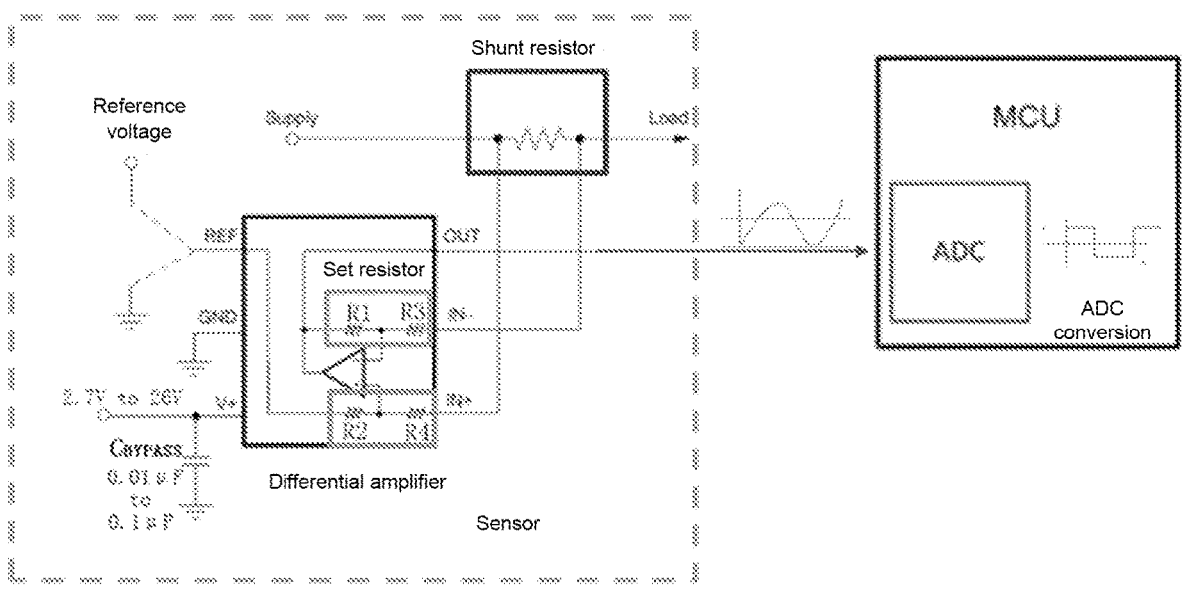
FIG. 1 is a circuit diagram of hardware of a sensor inside a server power supply in the prior art.

Next, an equivalent circuit diagram of a sensor architecture shown in FIG. 1 is pushed out.

1. Since the shunt resistor is 0.5 m milliohm (m ohm)-1 m ohm, and the set resistors R1, R2, R3, and R4 are generally set to a few kilohm (K ohm), the shunt resistor may be equivalent to a short circuit, such that the set resistors R3 and R4 may be docked.
2. A Kirchhoff circuit law is used, and a REF reference voltage and an output end OUT of the differential amplifier may be equivalent to short circuits, such that the set resistors R1 and R2 may be docked.
3. An equivalent circuit of the sensor architecture shown in FIG. 7 is pushed out, R2\*R3=R1\*R4 (R3/R1=R4/R2) is set, the Wheatstone bridge balance method is used, and in this case, a drifting voltage is equivalent to zero.

In this case, the output of the differential amplifier is: Vo=(R1/R3)\*($V_{IN+}-V_{IN-}$), where R1/R3 is a gain value of the differential amplifier.

In conclusion, the following conclusions are drawn to adjust sensor hardware to achieve optimization.

1) The signal amplification ratio of the differential amplifier may be increased by means of adjusting the R1 and the R3.
2) The drifting voltage of the differential amplifier may be equivalent to zero by means of R2\*R3=R1\*R4 (R3/R1=R4/R2). R1=R2=R3=R4 may be achieved by means of an optimization design.

The present disclosure further provides a measurement correction apparatus for a sensor. The measurement correction apparatus for the sensor may include a computer device. The computer device may be a terminal or a server. An internal structure diagram of the measurement correction apparatus for a sensor may be shown in FIG. 8. The measurement correction apparatus for a sensor includes a processor, a memory, a network interface, and an input apparatus that are connected by using a system bus. The processor is configured to provide computing and control capabilities. The memory includes a non-transitory storage medium or an internal memory. The non-transitory storage medium stores an operating system and a computer-readable instruction. The internal memory provides an environment for the running of the operating system and the computer-readable instruction in the non-transitory storage medium. The network interface of the computer device is configured to be communicatively connected with an external terminal or a server by means of a network. The measurement correction method for a sensor is implemented in response to the computer-readable instruction being executed by a processor. The input apparatus may be a touch layer covered on the display screen, may be a button, a trackball or a touch-control panel which are provided on a housing of the computer device, or may be an external keyboard, touch-control panel or mouse.

Figure 8:
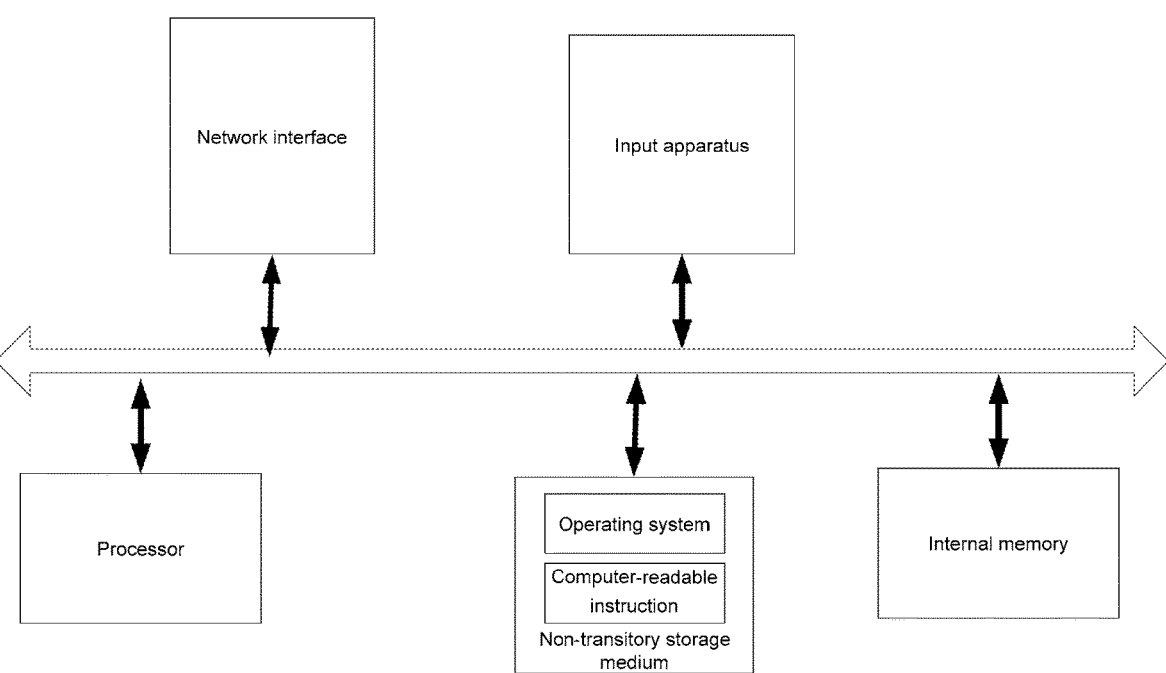
FIG. 8 is a schematic structural diagram of a measurement correction apparatus for a sensor based on one or more embodiments of the present disclosure.

It may be understood by those skilled in the art that the structure shown in FIG. 8, which is only a block diagram of a portion of the structure associated with the methods of the present disclosure, does not constitute a limitation of the device to which the methods of the present disclosure are applied. The specific device may include more or fewer components than shown in the figures, or be combined with certain components, or have a different arrangement of components.

For the introduction of the measurement correction apparatus provided in the present disclosure, refer to the embodiments of the measurement correction method, and in the present disclosure, details are not described herein again.

An embodiment of the present disclosure further provides a non-transitory readable storage medium. The non-transitory readable storage medium stores the computer-readable instruction, and in response to the computer-readable instruction being executed by at least one processor, steps of the measurement correction method for a sensor described in any one of the above embodiments may be implemented.

The description of the relevant part of the measurement correction apparatus for a sensor and the readable storage medium provided in the embodiments of the present disclosure may be found in the detailed description of the corresponding part of the measurement correction method for a sensor provided in the embodiments of the present disclosure, which is not described herein again.

Those of ordinary skill in the art will appreciate that implementing all or part of the processes in the methods described above may be accomplished by instructing associated hardware by a computer-readable instruction, which may be stored in a non-transitory computer-readable storage medium, which, in response to executing, may include processes as embodiments of the methods described above. Any reference to a memory, storage, a database, or other media used in the embodiments provided in the present disclosure may include nonvolatile and/or volatile memories. The non-transitory memories may include a Read-Only Memory (ROM), a Programmable ROM (PROM), an Electrically Programmable ROM (EPROM), an Electrically Erasable And Programmable ROM (EEPROM), or a flash memory. The volatile memories may include a Random Access Memory (RAM), or an external cache memory. As not a limitation but an illustration, the RAM is available in many forms, such as a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchronous Chain Channel (Synchlink) DRAM (SLDRAM), a Direct Memory Bus Dynamic RAM (DRDRAM), and a Memory Bus Dynamic RAM (RDRAM), among others.

An embodiment of the present disclosure further provides a server power supply. The server power supply includes the sensor and the measurement correction apparatus for the sensor. The sensor includes the shunt resistor, and the differential amplification circuit comprises a differential amplifier, a first resistor, a second resistor, a third resistor and a fourth resistor.

An input negative end of the differential amplifier is separately connected with a first end of the first resistor and a first end of the third resistor; a second end of the first resistor is connected with an output end of the differential amplifier; a second end of the third resistor is connected with a current output end of the shunt resistor; an input positive end of the differential amplifier is separately connected with a first end of the second resistor and a first end of the fourth resistor; a second end of the second resistor is connected with a reference end of the differential amplifier; a second end of the fourth resistor is connected with a current input end of the shunt resistor.

The ratio of the third resistor to the first resistor is equal to the ratio of the fourth resistor to the second resistor; and a gain value of the differential amplification circuit is adjusted by means of adjusting the ratio of the first resistor to the third resistor.

For the introduction of the server power supply provided in the present disclosure, refer to the embodiments of the measurement correction method and apparatus, and in the present disclosure, details are not described herein again.

It is also to be noted that relational terms such as first and second are used merely to distinguish one entity or operation from another entity or operation herein, and do not necessarily require or imply the existence of any such actual relationship or order between these entities or operations. Furthermore, terms "comprise", "include" or any other variants are intended to encompass non-exclusive inclusion, such that a process, a method, an article or a device including a series of elements not only include those elements, but also includes other elements not listed explicitly or includes intrinsic elements for the process, the method, the article, or the device. Without any further limitation, an element defined by the phrase "comprising one" does not exclude existence of other same elements in the process, the method, the article, or the device that includes the elements.

The foregoing description of the disclosed embodiments enables a person skilled in the art to implement or use the present disclosure. Obviously, the person skilled in the art will make many modifications to these embodiments, the general principles defined in the disclosure may be achieved in the other embodiments without departing from the spirit or scope of the present disclosure. Therefore, the present disclosure will not be limited to the embodiments shown herein, but to conform to the maximum extent of principles and new features that are disclosed herein.

What is claimed is:

1. A measurement correction method for a sensor, the measurement correction method is applied to the sensor comprising a shunt resistor and a differential amplification circuit, comprising:

performing compensation verification on the sensor in advance to obtain a compensation coefficient of the sensor;

acquiring a voltage signal outputted through the sensor; and correcting the voltage signal based on an error value of the shunt resistor and the compensation coefficient to obtain a voltage correction signal for using in system optimization management;

wherein correcting the voltage signal based on the error value of the shunt resistor and the compensation coefficient to obtain the voltage correction signal comprises:

correcting the voltage signal based on a preset voltage correction relational expression $$V_{o\_real} = (ADC_{Count} - Rshunt_{Count}) * \frac{S_{cale}}{V_{Gain}}$$

to obtain the voltage correction signal;

wherein $V_{o\_real}$ is the voltage correction signal; $ADC_{Count}$ is a digital signal value corresponding to the voltage signal; $Rshunt_{Count}$ is a digital signal value corresponding to the error value of the shunt resistor; and $V_{Gain}$ is a gain value of the differential amplification circuit, $S_{cale}$ is the compensation coefficient.

2. The measurement correction method for the sensor as claimed in claim 1, wherein performing compensation verification on the sensor in advance to obtain the compensation coefficient of the sensor comprises:

receiving an instruction which enter a manual self-learning mode, and entering the manual self-learning mode;

based on different setting values of a load of a device where the sensor is located, obtaining initial measurement values to be verified of the sensor at the different setting values; and calculating the compensation coefficient of the sensor based on a preset compensation coefficient relational expression $$S_{cale} = \frac{A2_{ADC_{Count}} - A1_{ADC_{Count}}}{B2_{ADC_{Count}} - B1_{ADC_{Count}}},$$

wherein $S_{cale}$ is the compensation coefficient; $A1_{ADC_{Count}}$ is an actual digital signal value of a parameter to be measured corresponding to the sensor at a first load setting value; $A2_{ADC_{Count}}$ is an actual digital signal value of the parameter to be measured at a second load setting value;

$B1_{ADC_{Count}}$ is a digital signal value corresponding to the initial measurement value to be verified of the sensor at the first load setting value; and $B2_{ADC_{Count}}$ is a digital signal value corresponding to the initial measurement value to be verified of the sensor at the second load setting value.

3. The measurement correction method for the sensor as claimed in claim 2, wherein further comprising:

in response to an automatic self-learning mode being triggered, entering the automatic self-learning mode;

acquiring a new measurement value to be verified of the sensor at a current load setting value; and calculating an updated compensation coefficient of the sensor based on a preset compensation coefficient update relational expression $$S'_{cale} = \frac{A2'_{ADC_{Count}} - A1_{ADC_{Count}}}{B2'_{ADC_{Count}} - B1_{ADC_{Count}}}$$

to correct the voltage signal based on the updated compensation coefficient, wherein $S'_{cale}$ is the updated compensation coefficient; $B2'_{ADC_{Count}}$ is a digital signal value corresponding to the new measurement value to be verified; and $A2'_{ADC_{Count}}$ is an actual digital signal value of the parameter to be measured at the current load setting value.

4. The measurement correction method for the sensor as claimed in claim 3, wherein triggering the automatic self-learning mode comprises:

in response to the device where the sensor is located operating, acquiring measurement values to be verified of the sensor at the current load setting value for multiple times, calculating an average measurement value to be verified of multiple acquired measurement values to be verified based on a moving average algorithm; and triggering the automatic self-learning mode in response to a difference value between the average measurement value to be verified and the initial measurement value to be verified corresponding to the sensor at the current load setting value being greater than a preset error threshold.

5. The measurement correction method for the sensor as claimed in claim 4, wherein before the automatic self-learning mode is triggered in response to a difference value between the average measurement value to be verified and the initial measurement value to be verified corresponding to the sensor at the current load setting value being greater than a preset error threshold, further comprising:

determining whether the difference value of the average measurement value to be verified and the initial measurement value to be verified is greater than the preset error threshold.

6. The measurement correction method for the sensor as claimed in claim 4, wherein the moving average algorithm is an Simple Moving Average (SMA) algorithm.

7. The measurement correction method for the sensor as claimed in claim 3, wherein triggering the automatic self-learning mode comprises:

receiving an instruction which enter the automatic self-learning mode, and triggering the automatic self-learning mode;

wherein a condition for issuing the instruction which enter the automatic self-learning mode is as follow, a difference value of an average value of the measurement values to be verified of the sensor at the current load setting value acquired for multiple times higher than an intermediate value of the measurement values to be verified acquired for multiple times does not reach a preset bias error threshold.

8. The measurement correction method for the sensor as claimed in claim 7, wherein the instruction which enter the automatic self-learning mode is issued through the system.

9. The measurement correction method for the sensor as claimed in claim 7, wherein before the instruction which enter the automatic self-learning mode is received, further comprising:

acquiring the measurement values to be verified of the sensor at the current load setting value for multiple times through the system;

determining whether the instruction which enter the automatic self-learning mode is issued through the system based on the measurement values to be verified.

10. The measurement correction method for the sensor as claimed in claim 9, wherein after whether the instruction which enter the automatic self-learning mode is issued through the system based on the measurement values to be verified is determined, further comprising:

calculating the average value of the measurement values to be verified of the sensor acquired for multiple times;

calculating the difference value of the average value of the measurement values to be verified of the sensor acquired for multiple times higher than a median value of the measurement values to be verified acquired for multiple times;

issuing the instruction which enter the automatic self-learning mode based on the difference value of the average value of the measurement values to be verified of the sensor at the current load setting value acquired for multiple times higher than an intermediate value of the measurement values to be verified acquired for multiple times does not reach the preset bias error threshold.

11. The measurement correction method for the sensor as claimed in claim 3, wherein further comprising:

pre-defining a function of entering a self-learning mode for a first instruction address of function to be defined in the device, pre-defining a function of returned by a self-learning mode state for a second instruction address of function to be defined in the device, wherein the self-learning mode comprises the manual self-learning mode and the automatic self-learning mode;

in response to the instruction which enter the manual self-learning mode or the automatic self-learning mode being received, writing a setting value instructing to enter the manual self-learning mode or a setting value instructing to enter the automatic self-learning mode into the first instruction address to start entering the manual self-learning mode or the automatic self-learning mode; and writing a corresponding setting value into the second instruction address based on a learning state of the current self-learning mode, and feeding back information of the second instruction address written with the corresponding setting value to a system.

12. The measurement correction method for the sensor as claimed in claim 3, wherein further comprising:

storing the measurement values to be verified which are acquired in the manual self-learning mode and the automatic self-learning mode into a memory in the device to determine the total number of self-learning through querying stored content of the memory for using in managing capacity resources of the memory.

13. A measurement correction apparatus for a sensor, comprising a memory, and at least one processor, wherein the memory stores a computer-readable instruction, and in response to the computer-readable instruction is executed by the at least one processor, cause the processor to:

perform compensation verification on the sensor in advance to obtain a compensation coefficient of the sensor;

acquire a voltage signal outputted through the sensor; and correct the voltage signal based on an error value of the shunt resistor and the compensation coefficient to obtain a voltage correction signal for using in system optimization management;

wherein correct the voltage signal based on a preset voltage correction relational expression $$V_{\text{o\_real}} = (ADC_{Count} - Rshunt_{Count}) * \frac{S_{cale}}{V_{Gain}}$$

to obtain the voltage correction signal;

wherein Vo_real is the voltage correction signal; $ADC_{Count}$ is a digital signal value corresponding to the voltage signal; $Rshunt_{Count}$ is a digital signal value corresponding to the error value of the shunt resistor; and $V_{Gain}$ is a gain value of the differential amplification circuit, $S_{cale}$ is the compensation coefficient.

14. A server power supply, comprising a sensor and the measurement correction apparatus for a sensor as claimed in claim 9, wherein the sensor comprises a shunt resistor, and a differential amplification circuit comprises a differential amplifier, a first resistor, a second resistor, a third resistor and a fourth resistor, wherein an input negative end of the differential amplifier is separately connected with a first end of the first resistor and a first end of the third resistor; a second end of the first resistor is connected with an output end of the differential amplifier; a second end of the third resistor is connected with a current output end of the shunt resistor; an input positive end of the differential amplifier is separately connected with a first end of the second resistor and a first end of the fourth resistor; a second end of the second resistor is connected with a reference end of the differential amplifier; a second end of the fourth resistor is connected with a current input end of the shunt resistor;

the ratio of the third resistor to the first resistor is equal to the ratio of the fourth resistor to the second resistor; and a gain value of the differential amplification circuit is adjusted by means of adjusting the ratio of the first resistor to the third resistor.

15. The server power supply as claimed in claim 14, wherein the differential amplifier is acquired based on a Wheatstone bridge balance method.

16. The measurement correction apparatus as claimed in claim 13, wherein in response to the computer-readable instruction is executed by the at least one processor, cause the processor to:

receive an instruction which enter a manual self-learning mode, and enter the manual self-learning mode;

based on different setting values of a load of a device where the sensor is located, obtain initial measurement values to be verified of the sensor at the different setting values; and calculate the compensation coefficient of the sensor based on a preset compensation coefficient relational expression $$S_{cale} = \frac{A2_{ADC_{Count}} - A1_{ADC_{Count}}}{B2_{ADC_{Count}} - B1_{ADC_{Count}}},$$

wherein $S_{cale}$ is the compensation coefficient; $A1_{ADC_{Count}}$ is an actual digital signal value of a parameter to be measured corresponding to the sensor at a first load setting value; $A2_{ADC_{Count}}$ is an actual digital signal value of the parameter to be measured at a second load setting value; $B1_{ADC_{Count}}$ is a digital signal value corresponding to the initial measurement value to be verified of the sensor at the first load setting value; and $B2_{ADC_{Count}}$ is a digital signal value corresponding to the initial measurement value to be verified of the sensor at the second load setting value.

17. The measurement correction apparatus as claimed in claim 16, wherein in response to the computer-readable instruction is executed by the at least one processor, cause the processor to:

in response to an automatic self-learning mode being triggered, enter the automatic self-learning mode;

acquire a new measurement value to be verified of the sensor at a current load setting value; and calculate an updated compensation coefficient of the sensor based on a preset compensation coefficient update relational expression $$S'_{cale} = \frac{A2'_{ADC_{Count}} - A1_{ADC_{Count}}}{B2'_{ADC_{Count}} - B1_{ADC_{Count}}}$$

to correct the voltage signal based on the updated compensation coefficient, wherein $S'_{cale}$ is the updated compensation coefficient; $B2'_{ADC_{Count}}$ is a digital signal value corresponding to the new measurement value to be verified; and $A2'_{ADC_{Count}}$ is an actual digital signal value of the parameter to be measured at the current load setting value.

18. The measurement correction apparatus as claimed in claim 16, wherein in response to the computer-readable instruction is executed by the at least one processor, cause the processor to:

in response to the device where the sensor is located operating, acquire measurement values to be verified of the sensor at the current load setting value for multiple times, calculate an average measurement value to be verified of multiple acquired measurement values to be verified based on a moving average algorithm; and trigger the automatic self-learning mode in response to a difference value between the average measurement value to be verified and the initial measurement value to be verified corresponding to the sensor at the current load setting value being greater than a preset error threshold.

* * * * *